United States Patent
Minotani et al.

(10) Patent No.: US 12,425,279 B2
(45) Date of Patent: *Sep. 23, 2025

(54) CONNECTING CIRCUIT AND COMMUNICATION INTERFACE

(71) Applicants: Nippon Telegraph and Telephone Corporation, Tokyo (JP); NTT Innovative Devices Corporation, Yokohama (JP)

(72) Inventors: Tadashi Minotani, Tokyo (JP); Toshiki Kishi, Tokyo (JP); Masatoshi Tobayashi, Yokohama (JP); Yoshikazu Urabe, Yokohama (JP)

(73) Assignees: NIPPON TELEGRAPH AND TELEPHONE CORPORATION, Tokyo (JP); NTT INNOVATIVE DEVICES CORPORATION, Yokohama (JP)

( * ) Notice: Subject to any disclaimer, the term of this patent is extended or adjusted under 35 U.S.C. 154(b) by 107 days.

This patent is subject to a terminal disclaimer.

(21) Appl. No.: 18/551,646

(22) PCT Filed: Mar. 25, 2022

(86) PCT No.: PCT/JP2022/014484
§ 371 (c)(1),
(2) Date: Sep. 21, 2023

(87) PCT Pub. No.: WO2022/203053
PCT Pub. Date: Sep. 29, 2022

(65) Prior Publication Data
US 2024/0179035 A1    May 30, 2024

(30) Foreign Application Priority Data

Mar. 25, 2021   (JP) .................. 2021-051315

(51) Int. Cl.
*H04L 25/06* (2006.01)

(52) U.S. Cl.
CPC .................. *H04L 25/06* (2013.01)

(58) Field of Classification Search
CPC ...... H04L 25/06; H04L 25/03; H03K 19/0175
See application file for complete search history.

(56) References Cited

U.S. PATENT DOCUMENTS

2014/0269998 A1*  9/2014  Kizer ............... H04L 25/06
                                                                    375/319
2016/0080843 A1*  3/2016  Charbonneau-Lefort ...............
                                                              H04B 10/695
                                                                    398/45

(Continued)

FOREIGN PATENT DOCUMENTS

JP       2007267015 A    10/2007

OTHER PUBLICATIONS

Goto, H., "Intel's packaging technology is quietly advancing in the chiplet race," https://pc.watch.impress.co.jp/docs/column/kaigai/1227139.html, Dec. 27, 2019, 8 pages, as described in the Specification.

(Continued)

*Primary Examiner* — Sam K Ahn
*Assistant Examiner* — Amneet Singh
(74) *Attorney, Agent, or Firm* — Slater Matsil, LLP

(57) ABSTRACT

An embodiment is a connecting circuit connected to the preceding stage of a transmission circuit and configured to receive a baseband signal, includes an isolation element connected between an input terminal and an output terminal, a signal midpoint detection circuit connected parallel to the isolation element, a bias adding circuit connected in series with the signal midpoint detection circuit, and an initial voltage value detection circuit connected to a frame detection circuit. The initial voltage value detection circuit holds (Continued)

an initial voltage value of the baseband signal in accordance with the signal of the frame detection circuit, and outputs the initial voltage value to the signal midpoint detection circuit. The signal midpoint detection circuit detects a midpoint voltage from the baseband signal and the initial voltage value, and outputs the midpoint voltage to the bias adding circuit. The bias adding circuit adds the midpoint voltage to a bias voltage.

17 Claims, 7 Drawing Sheets

(56) References Cited

U.S. PATENT DOCUMENTS

2016/0191171 A1* 6/2016 Walker .............. H04B 10/541
                                                    398/183
2016/0218854 A1   7/2016 Chong

OTHER PUBLICATIONS

International Bureau, "Notification Concerning Transmittal of International Preliminary Report on Patentability (Chapter 1 of The Patent Cooperation Treaty)," International application No. PCT/JP2022/014485, Oct. 5, 2023, 9 pages.

International Searching Authority, "Written Opinion of the International Searching Authority," International application No. PCT/JP2022/014485, Jun. 21, 2022, 6 pages.

Japan Patent Office, "International Search Report," International application No. PCT/JP2022/014485, Jun. 21, 2022, 5 pages.

\* cited by examiner

CONNECTING CIRCUIT AND COMMUNICATION INTERFACE

CROSS-REFERENCE TO RELATED APPLICATIONS

This patent application is a national phase entry of PCT Application No. PCT/JP2022/014484, filed on Mar. 25, 2022, which claims priority to Japanese Patent Application No. 2021-051315, filed on Mar. 25, 2021. Both of the aforementioned applications are hereby incorporated by reference in their entireties.

TECHNICAL FIELD

The present invention relates to a connecting circuit connected to a transmission circuit, and a communication interface.

BACKGROUND

To improve the data processing capability of a computer, a large amount of data needs to be transmitted/received to/from the computer. To do so, it is promising to use many high-speed interfaces such as optical communication for transmission/reception. In some cases, the chip of a CPU or GPU serving as the data processing part of the computer and the chip of an optical communication interface are separately manufactured and connected by wiring on a board. At this time, a chip capacitor for a DC block is sometimes inserted to block a DC current flowing through a path between the chip of the CPU or GPU serving as a data source and the chip of the optical communication interface.

In this connection form, the chip of the CPU or GPU serving as the data processing part of the computer is often mounted on a package substrate such as a buildup substrate. When the chip for optical communication is also mounted on the package substrate, the chip capacitor for the DC block needs to be removed because of a limited area of the package substrate.

A connection form using a transmission interface 5 shown in FIG. 10 is considered, in which the chip capacitor is removed from the connection form in the conventional transmission interface. In the transmission interface 5, a transmission circuit 52 is biased at a bias voltage suited to the transmission circuit 52, and separated by a capacitor 53 to prevent a DC current from flowing through a connection with a data source 3 to change the bias voltage. In FIG. 10, inserted FIG. 561 is a graph of the DC component of a signal input to the transmission interface, and inserted FIG. 562 is a graph of the DC component of a signal input to the transmission circuit.

RELATED ART LITERATURE

Non-Patent Literature

Non-Patent Literature 1:
https://pc.watch.impress.co.jp/docs/column/kaigai/1227139.html

SUMMARY

Problem to be Solved by Embodiments of the Invention

However, when a baseband signal is transmitted from the data source 3 to the transmission interface 5, a DC component included in the baseband signal gradually attenuates in accordance with a CR time constant determined by the capacitor 53 and a resistor 54 under the influence of the capacitor 53. As a result, a waveform distortion is generated in the baseband signal (inserted FIG. 562 in FIG. 10). If the bias voltage of the transmission circuit 52 is adjusted to a data signal immediately after data input, data whose DC component is attenuated by the CR time constant is not accurately transmitted. To the contrary, if the bias voltage of the transmission circuit 52 is adjusted to a data signal after the DC component is attenuated by the CR time constant, data immediately after data input is not accurately transmitted. In this manner, the conventional transmission interface cannot accurately transmit data.

It is an object of embodiments of the present invention to provide a connecting circuit and a communication interface that can transfer, to a transmission circuit, a waveform distortion-reduced baseband signal including a DC component by an arrangement in which a chip capacitor for a DC block is removed and a capacitor is incorporated in a transmission interface chip.

Means of Solution to the Problem

To solve the above-described problems, according to embodiments of to the present invention, there is provided a connecting circuit connected to a preceding stage of a transmission circuit and configured to receive a baseband signal, comprising a separation element connected between an input terminal and an output terminal, a signal midpoint detection unit connected parallel to the separation element, a bias adding unit connected in series with the signal midpoint detection unit, and an initial voltage value detection circuit connected to a frame detection circuit, wherein the initial voltage value detection circuit holds an initial voltage value of the baseband signal in accordance with a signal of the frame detection circuit, and outputs the initial voltage value to the signal midpoint detection unit, the signal midpoint detection unit detects a midpoint voltage from the baseband signal and the initial voltage value, and outputs the midpoint voltage to the bias adding unit, and the bias adding unit adds the midpoint voltage to a bias voltage for biasing the baseband signal.

According to embodiments of the present invention, there is provided a connecting circuit connected to a preceding stage of a plurality of transmission circuits and configured to receive a plurality of baseband signals, comprising a plurality of separation elements respectively connected between a plurality of input terminals and a plurality of output terminals, a plurality of signal midpoint detection units connected parallel to the respective separation elements, a plurality of bias adding units connected in series with the respective signal midpoint detection units, and an inter-channel interpolation VL detection circuit, wherein the inter-channel interpolation VL detection circuit detects a low-voltage signal among the plurality of baseband signals, and outputs the low-voltage signal to the respective signal midpoint detection units, the signal midpoint detection units detect a midpoint voltage from the baseband signals and the low-voltage signal, and output the midpoint voltage to the bias adding units, and the bias adding units add the midpoint voltage to a bias voltage for biasing the baseband signal.

According to embodiments of the present invention, there is provided a connecting circuit connected to a preceding stage of a plurality of transmission circuits and configured to receive a plurality of baseband signals, comprising a plurality of separation elements respectively connected between a plurality of input terminals and a plurality of output terminals, a plurality of frame detection circuits connected parallel to the respective separation elements, a plurality of switching elements connected in series with the respective frame detection circuits, a plurality of bias adding units connected in series with the respective switching elements, and a difference average midpoint voltage calculation unit to which an output of an inter-channel interpolation VL detection circuit and an output of an inter-channel interpolation VH detection circuit are input, wherein the inter-channel interpolation VL detection circuit detects a low-voltage signal among the plurality of baseband signals, and outputs the low-voltage signal to the difference average midpoint voltage calculation unit, the inter-channel interpolation VH detection circuit detects a high-voltage signal among the plurality of baseband signals, and outputs the high-voltage signal to the difference average midpoint voltage calculation unit, the difference average midpoint voltage calculation unit outputs, to the switching elements, a midpoint voltage based on the output of the inter-channel interpolation VL detection circuit and the output of the inter-channel interpolation VH detection circuit, the switching elements output the midpoint voltage to the bias adding units in accordance with inputs from the frame detection circuits, and the bias adding units add the midpoint voltage to a bias voltage for biasing the baseband signal.

Effect of Embodiments of the Invention

According to embodiments of the present invention, a connecting circuit and a communication interface that can transfer, to a transmission circuit, a waveform distortion-reduced baseband signal including a DC component can be provided.

DETAILED DESCRIPTION OF ILLUSTRATIVE EMBODIMENTS

First Embodiment

Figure 1:
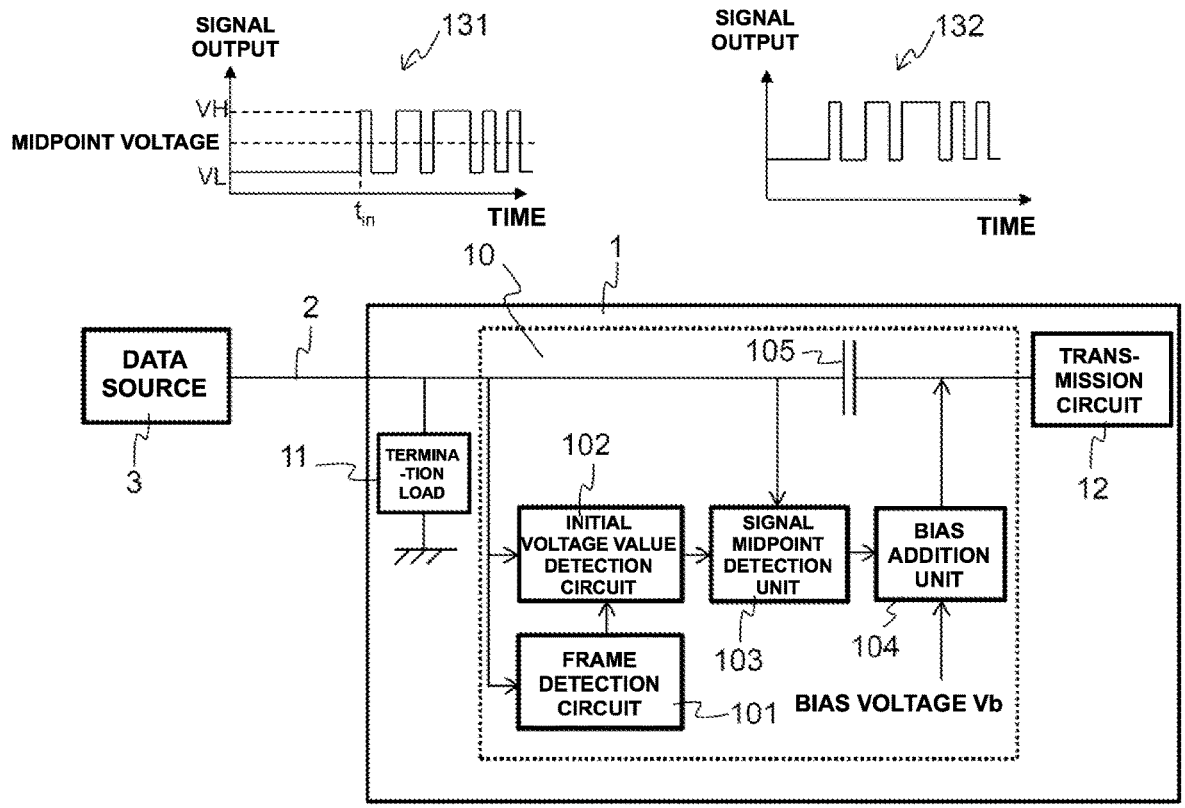
FIG. 1 is a block diagram showing the arrangement of a transmission interface using a connecting circuit according to the first embodiment of the present invention.

A connecting circuit and a communication interface according to the first embodiment of the present invention will be described with reference to FIGS. 1 to 4.
Arrangements of Connecting Circuit and Communication Interface The block diagram of a transmission interface 1 using the connecting circuit according to the embodiment is shown. As shown in FIG. 1, the transmission interface 1 includes a connecting circuit 10 according to the embodiment, a terminal load 11, and a transmission circuit 12. In the transmission interface 1, the connecting circuit 10 is connected between the terminal load 11 and the transmission circuit 12, and a baseband signal (to be also referred to as a "data signal" hereinafter) is input from a data source 3 via a transmission line 2. The data source 3 is a CPU, a GPU, or the like. In FIG. 1, inserted FIG. 131 is a graph of the DC component of a signal input to the transmission interface, and inserted FIG. 132 is a graph of the DC component of a signal input to the transmission circuit. Inserted FIG. 131 shows a low voltage VL, a high voltage VH, and a voltage at a midpoint (midpoint voltage) between VL and VH in the input signal. Inserted FIG. 131 also shows data input time $t_{in}$.

Figure 2:
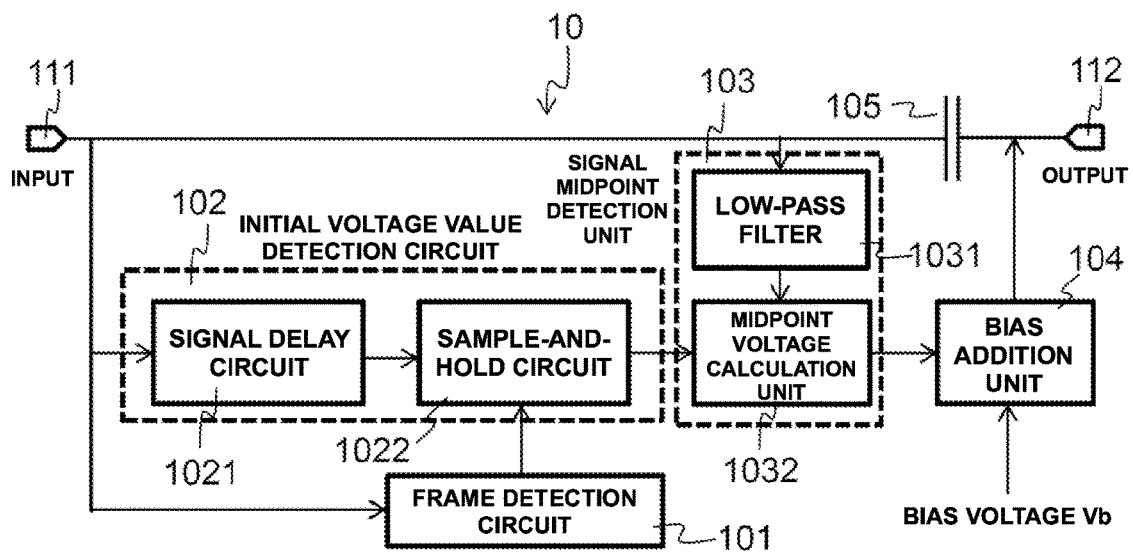
FIG. 2 is a block diagram showing the arrangement of the connecting circuit according to the first embodiment of the present invention.

As shown in FIG. 2, the connecting circuit 10 according to the embodiment includes an initial voltage value detection circuit 102, a frame detection circuit 101, a signal midpoint detection unit 103, a bias adding unit 104, and an isolation element 105. As the isolation element 105, an element (capacitor) such as a condenser having a capacitor, or a photocoupler can be used.

The frame detection circuit 101 detects a change of the voltage obtained when a data signal output from the data source 3 is input, and outputs a frame detection signal. The frame detection circuit 101 can be constituted by a multivibrator circuit, a chattering elimination RS latch circuit, a low-pass filter, or the like.

The initial voltage value detection circuit 102 includes a signal delay circuit 1021 and a sample-and-hold circuit 1022 in order from an input terminal 111 side. The initial voltage value detection circuit 102 detects a voltage (to be referred to as an "initial voltage value" hereinafter) obtained when no data signal is input, holds the initial voltage value in response to input of a frame detection signal, and outputs the initial voltage value.

The signal midpoint detection unit 103 includes a low-pass filter 1031 and a midpoint voltage calculation unit 1032 in order from the input terminal 111 side. The signal midpoint detection unit 103 detects a midpoint voltage serving as a voltage at a midpoint between high and low voltages among voltages of data.

When a data signal is input, the bias adding unit 104 adds a midpoint voltage and biases a baseband signal input to the transmission circuit.

In the connecting circuit 10, a circuit constituted by the frame detection circuit 101, the initial voltage value detection circuit 102, the signal midpoint detection unit 103, and the bias adding unit 104 is connected parallel to the isolation element 105.

In the circuit connected parallel to the isolation element 105, the frame detection circuit 101, the signal delay circuit 1021 of the initial voltage value detection circuit 102, and the low-pass filter 1031 of the signal midpoint detection unit 103 are parallel-connected.

The sample-and-hold circuit 1022 is connected to the signal delay circuit 1021 of the initial voltage value detection circuit 102, and the output of the frame detection circuit 101 is input (connected) to the sample-and-hold circuit 1022.

The midpoint voltage calculation unit 1032 is connected to the low-pass filter 1031 of the signal midpoint detection unit 103, and the output of the sample-and-hold circuit 1022 is input (connected) to the midpoint voltage calculation unit 1032.

The output of the midpoint voltage calculation unit 1032 is input (connected) to the bias adding unit 104.

The bias adding unit 104 adds the output of the midpoint voltage calculation unit 1032 to the bias voltage and outputs the sum.

Operation of Connecting Circuit

The operation of the connecting circuit 10 according to the embodiment will be described with reference to FIG. 3.

Before a data signal is input to the connecting circuit 10, the data source 3 outputs the low voltage VL as an initial voltage value. After a signal is input, the waveform changes between the high voltage VH and the low voltage VL from the start of data of the signal in accordance with the data (141 in FIG. 3).

Figure 3:
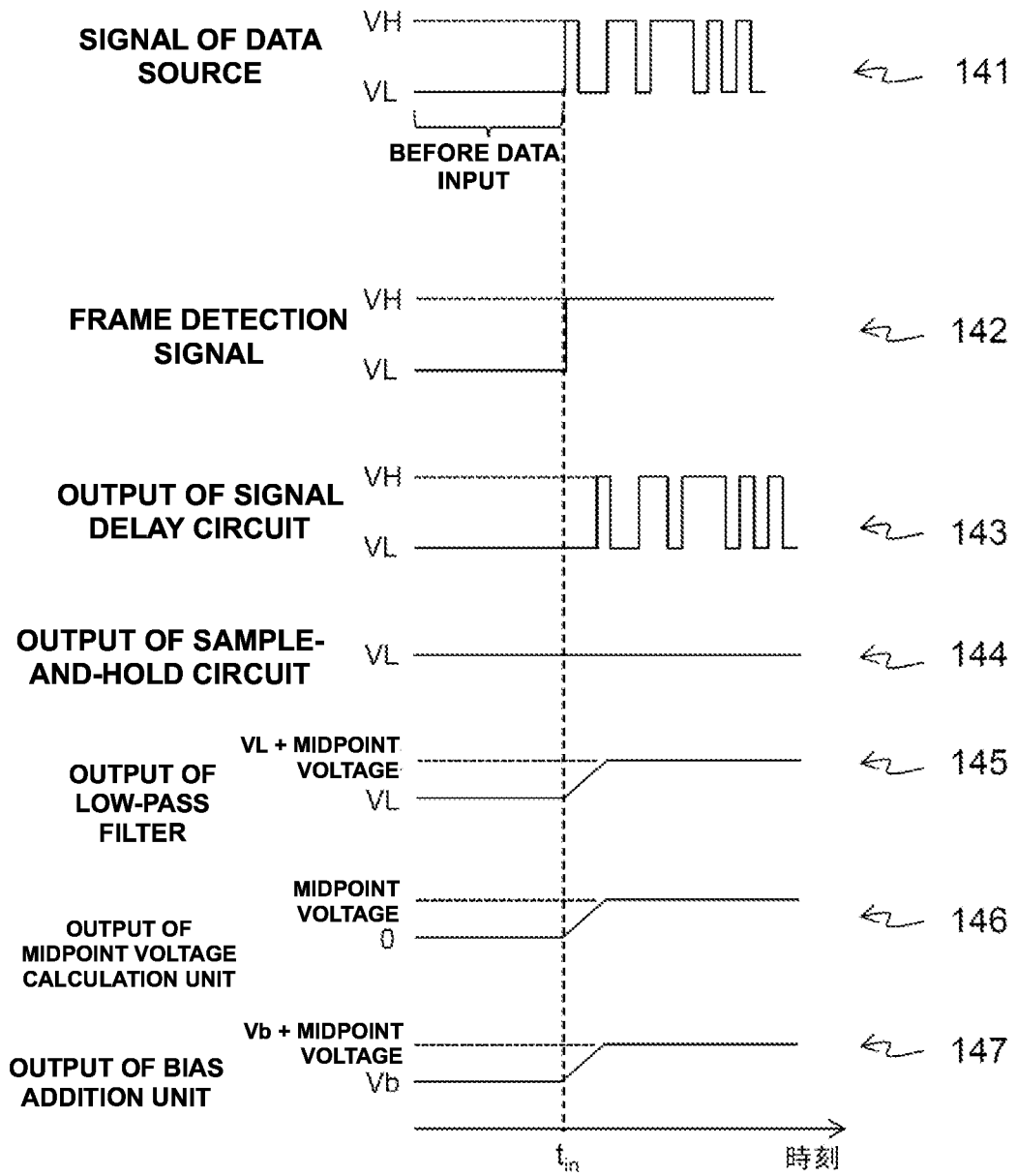
FIG. 3 is a timing chart for explaining the operation of the connecting circuit according to the first embodiment of the present invention.

The frame detection circuit 101 reads the change of the data signal, outputs a frame detection signal at the high voltage VH, and once the frame detection signal is output at the high voltage VH, keeps outputting it (142 in FIG. 3). Under a predetermined condition such that the low voltage VL continues for a predetermined time in the data signal, the frame detection circuit 101 stops the output of the high voltage VH and outputs the low voltage VL (not shown).

For example, in a case where a multivibrator circuit is used for the frame detection circuit 101, the multivibrator circuit outputs a rectangular wave (high voltage VH) of a predetermined time width in accordance with input of a data signal, continues the output for a predetermined time, and then outputs the low voltage VL.

For example, in a case where an RS latch circuit is used for the frame detection circuit 101, the RS latch circuit outputs the high voltage VH when a data signal is input (high voltage VH) to the other terminal of the RS latch circuit in a state in which no data signal is input to one terminal (not shown). Even when the data signal input to the other terminal changes to the low voltage VL, the RS latch circuit maintains the output of the high voltage VH. After that, when a data signal is input to one terminal (not shown), the RS latch circuit outputs the low voltage VL.

For example, in a case where a low-pass filter is used for the frame detection circuit 101, when a data signal including the high voltage VH is input, the signal change is relaxed and flattened, and the low-pass filter keeps outputting the frame detection signal. When the output of the low voltage VL continues in the data signal, the output of the flattened signal changes to the low voltage VL. Further, a comparator circuit can be connected to the subsequent stage of the low-pass filter to output the frame detection signal at the high voltage VH when the output of the low-pass filter is equal to or higher than a predetermined threshold, and output the frame detection signal at the low voltage VL when the output of the low-pass filter keeps lower than the predetermined threshold.

The signal delay circuit 1021 delays the data signal (143 in FIG. 3). As a result, when the frame detection signal is output, the output of the signal delay circuit 1021 is still at the low voltage VL of the initial voltage value before input of the data signal.

The signal delayed by the signal delay circuit 1021 is input to the sample-and-hold circuit 1022. Before the time ($t_{in}$) of inputting the data signal to the connecting circuit 10, the sample-and-hold circuit 1022 outputs the initial voltage value (low voltage VL) without any change. After the time ($t_{in}$) of inputting the data signal to the connecting circuit 10, when the above-mentioned frame detection signal is input to the sample-and-hold circuit 1022, the signal delay circuit 1021 inputs, to the sample-and-hold circuit 1022 at the low voltage VL, the initial voltage value before input of the data signal. Even after the data signal is input to the connecting circuit 10, the initial voltage value (low voltage VL) is held and output to the midpoint voltage calculation unit 1032 of the signal midpoint detection unit 103 (144 in FIG. 3).

The low-pass filter 1031 of the signal midpoint detection unit 103 outputs the initial voltage value VL before data input, and VL+ midpoint voltage obtained by flattening data after data output (145 in FIG. 3). The low-pass filter 1031 relaxes and flattens the signal change because the high-frequency component of the data signal is cut off and the data signal is formed from the low-frequency component. As a result, VL+ midpoint voltage obtained by adding VL and a midpoint voltage serving as the average value of the signal change is output. The output voltage increases from VL to VL+ midpoint voltage in accordance with the time constant inside the low-pass filter 1031.

The midpoint voltage calculation unit 1032 uses a normal subtraction circuit, and outputs a difference between the output of the low-pass filter 1031 and the output of the sample-and-hold circuit. Resultantly, o is output before data input, and the midpoint voltage is output after data input (146 in FIG. 3).

The bias adding unit 104 uses a normal addition circuit, and outputs the sum of a bias voltage Vb of the transmission circuit and the output (midpoint voltage) of the midpoint voltage calculation unit 1032 (147 in FIG. 3). The baseband signal input to the transmission circuit is biased at Vb before data input, and Vb+ midpoint voltage after data input.

Figure 4:
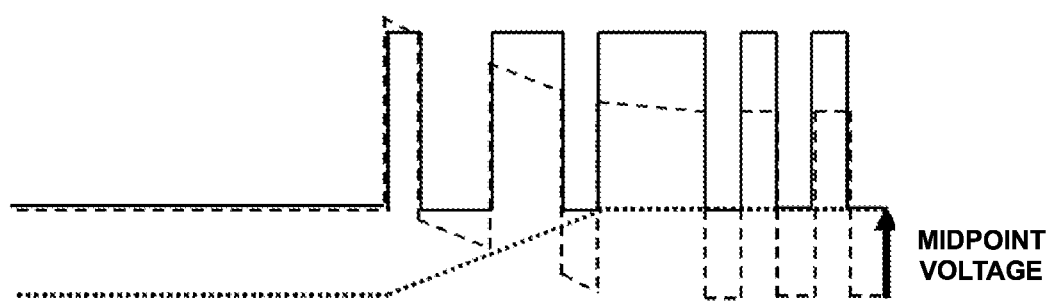
FIG. 4 is a graph of a signal for explaining the operation of the connecting circuit according to the first embodiment of the present invention.

The DC component of the baseband signal output from the data source 3 has a waveform distortion that attenuates in accordance with the CR time constant determined by the capacitor and the resistor of the connecting circuit 10 (broken line in FIG. 4). When the baseband signal is biased by the output (dotted line in FIG. 4) of the bias adding unit 104, the waveform distortion by the CR time constant in the DC component of the baseband signal is canceled by a change (increase) of the output of the bias adding unit 104 caused by the time constant inside the low-pass filter 1031 (solid line in FIG. 4). As a result, the waveform distortion of the baseband signal input to the transmission circuit is reduced.

As described above, the connecting circuit 10 according to the embodiment can bias a baseband signal output from the data source by a bias voltage to which the midpoint voltage of the baseband signal is added, and input the distortion-reduced baseband signal to the transmission circuit.

Even if a chip capacitor for a DC block is removed and a capacitor is incorporated in a transmission interface chip, the connecting circuit 10 according to the embodiment can transfer, to the transmission circuit, a waveform distortion-reduced baseband signal including a DC component. The chip serving as the data source and the chip of the transmission interface can be mounted at high density.

Second Embodiment

Figure 5:
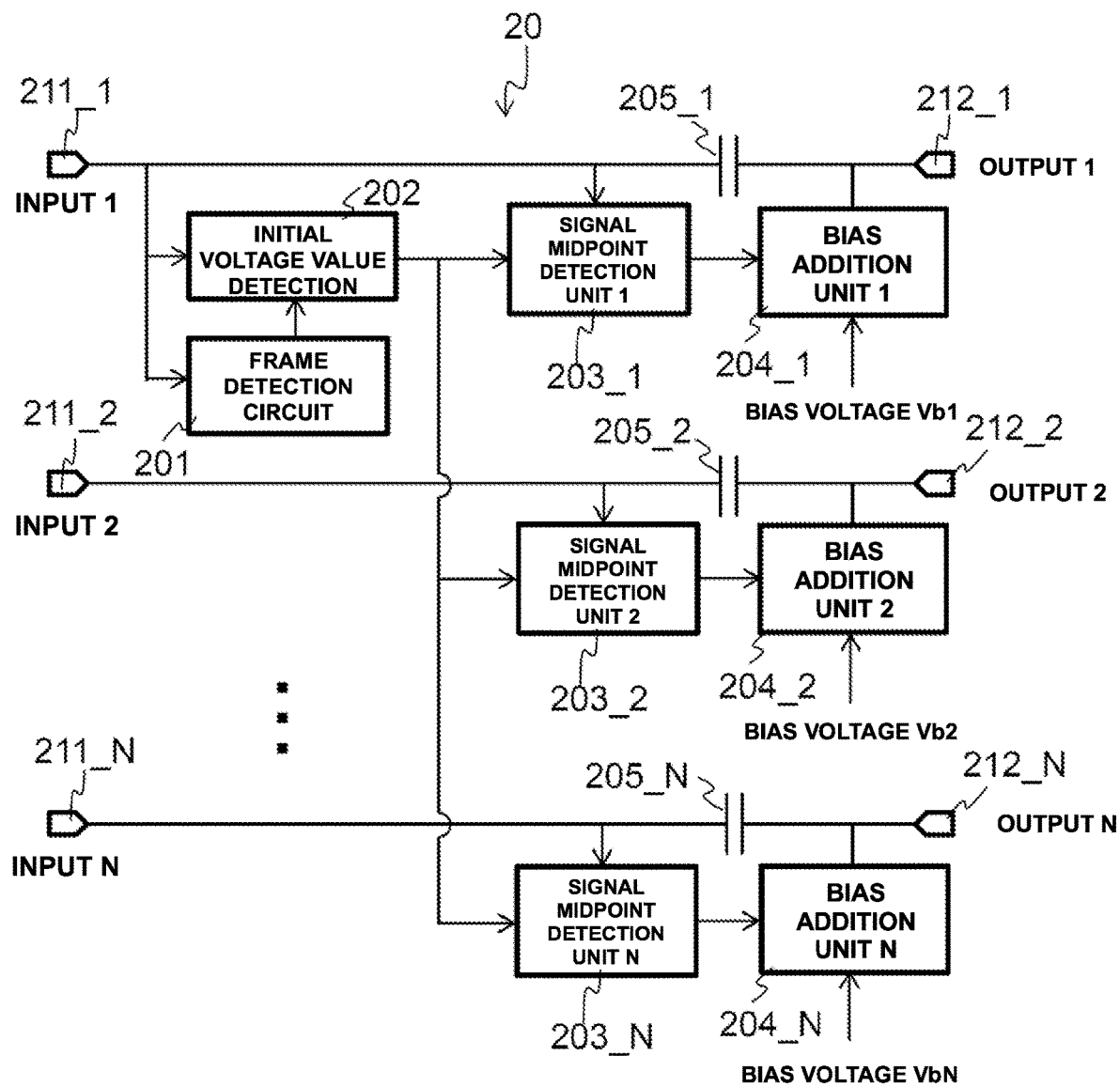
FIG. 5 is a block diagram showing the arrangement of a connecting circuit according to the second embodiment of the present invention.

A connecting circuit and a communication interface according to the second embodiment of the present invention will be described with reference to FIG. 5.
<Arrangement of Connecting circuit>
As shown in FIG. 5, a connecting circuit 20 according to the embodiment includes, for a plurality of (N) inputs and outputs, an initial voltage value detection circuit 202, a frame detection circuit 201, a plurality of (N) signal midpoint detection units 203_1 to 203_N, a plurality of (N) bias adding units 204_1 to 204_N, and a plurality of (N) isolation elements 205_1 to 205_N. The arrangements of the initial voltage value detection circuit 202 and the signal midpoint detection units 203_1 to 203_N, and the connection form of the initial voltage value detection circuit 202 and the frame detection circuit 201 are similar to those in the first embodiment.

In the connecting circuit 20, the signal midpoint detection units 203_1 to 203_N and the bias adding units 204_1 to 204_N are series-connected parallel to the isolation elements 205_1 to 205_N. The output of the initial voltage value detection circuit 202 connected to one input terminal (for example, an input terminal 211_1) out of a plurality of input terminals is input (connected) to the midpoint voltage calculation units of the signal midpoint detection units 203_1 to 203_N.
Operation of Connecting Circuit
Similar to the first embodiment, the initial voltage value detection circuit 202 outputs an initial voltage value VL regardless of input of a data signal. In the connecting circuit 20 according to the embodiment, the initial voltage value VL is output to the midpoint voltage calculation units of the signal midpoint detection units 203_1 to 203_N regardless of input of the data signal.

If the specification of an electric signal is the same in all inputs (1 to N) in the connecting circuit 20, the initial voltage value detection circuit 202 connected to one input terminal (for example, the input terminal 211_1) can output the same initial voltage value VL to all the signal midpoint detection units 203_1 to 203_N.

Similar to the first embodiment, the midpoint voltage calculation units of the signal midpoint detection units 203_1 to 203_N output differences between the outputs of low-pass filters and the output (initial voltage value VL) of the initial voltage value detection circuit 202, bias baseband signals input to a transmission circuit by the bias adding units 204_1 to 204_N, and reduce the waveform distortions of the baseband signals.

Similar to the first embodiment, the connecting circuit 20 according to the embodiment can be used for a transmission interface. In the transmission interface, terminal loads are connected to the respective input terminals of the connecting circuit 20, and transmission circuits are connected to the respective output terminals.

As described above, even if a capacitor is incorporated in a transmission interface chip without arranging a chip capacitor (chip capacitor for a DC block) between a data source and a transmission interface including a plurality of transmission circuits, the connecting circuit 20 according to the embodiment can transfer, to the transmission circuits, a waveform distortion-reduced baseband signal including a DC component. The chip serving as the data source and the chip of the transmission interface can be mounted at high density.

In the connecting circuit 20 according to the embodiment, only one initial voltage value detection circuit and one frame detection circuit are arranged, so the power consumption and the chip area can be reduced in comparison with an arrangement in which initial voltage value detection circuits and frame detection circuits are arranged for all inputs.

Third Embodiment

Figure 6:
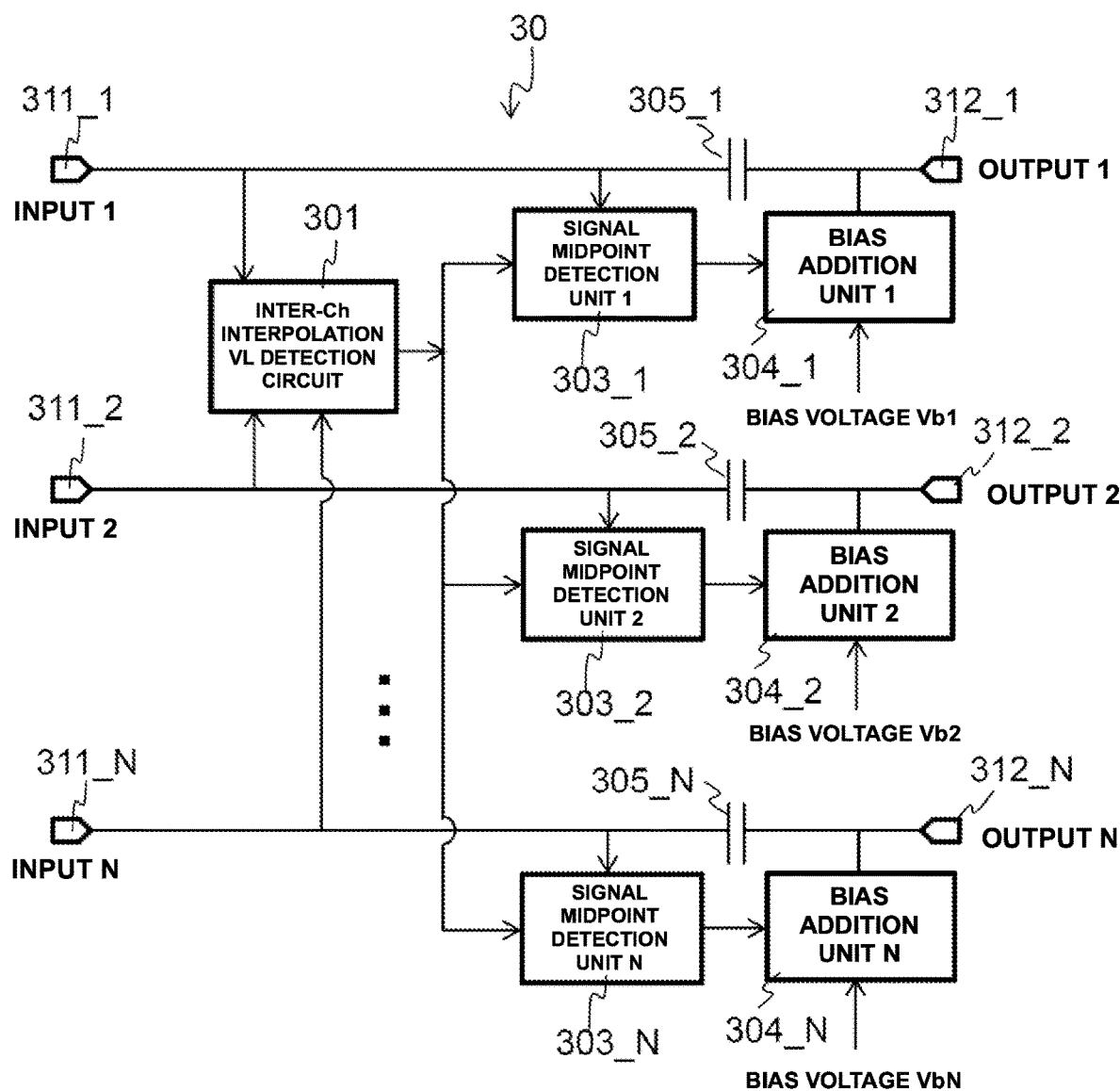
FIG. 6 is a block diagram showing the arrangement of a connecting circuit according to the third embodiment of the present invention.
Figure 7:
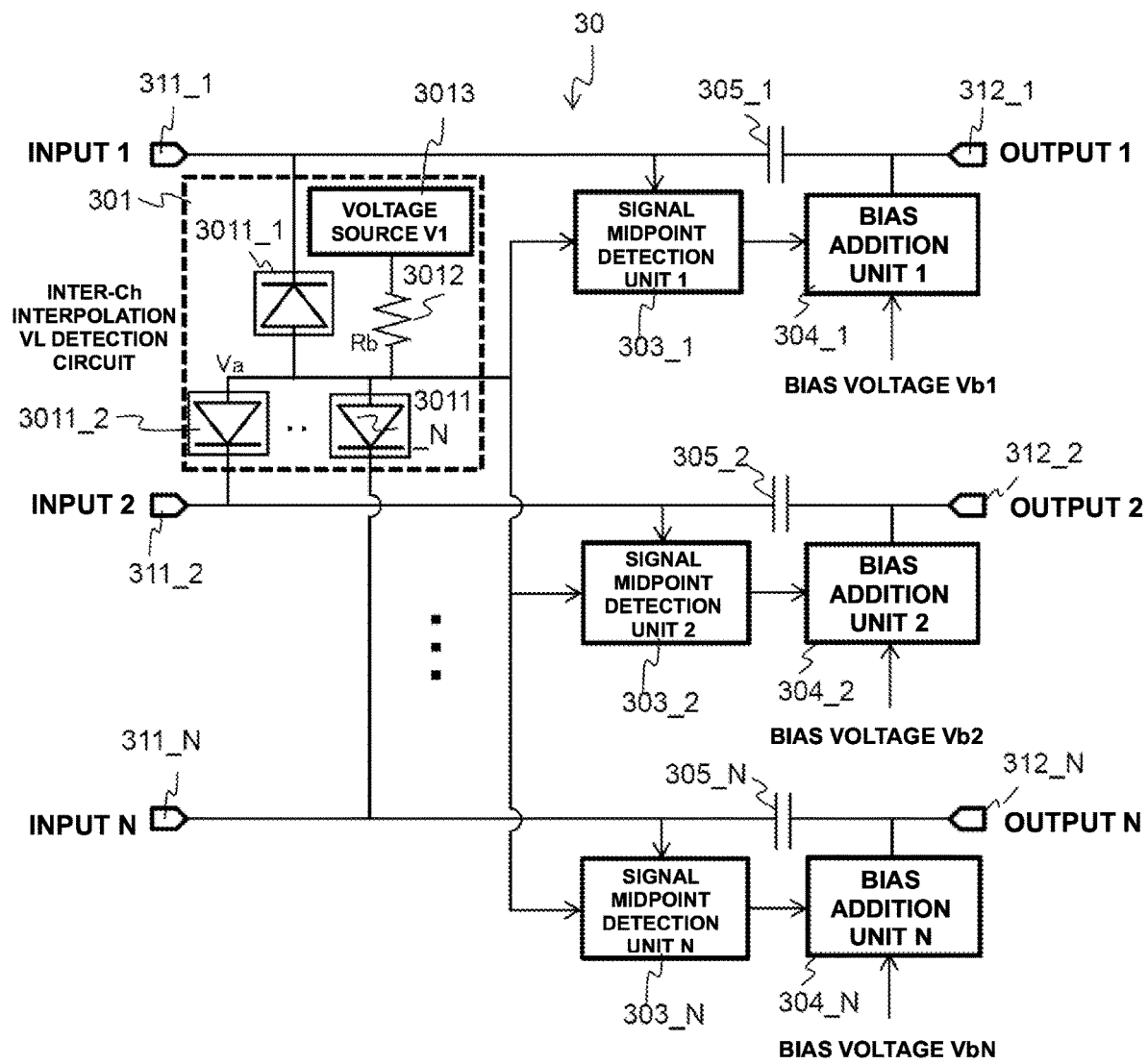
FIG. 7 is a block diagram showing the arrangement of the connecting circuit according to the third embodiment of the present invention.

A connecting circuit and a communication interface according to the third embodiment of the present invention will be described with reference to FIGS. 6 and 7. The connecting circuit according to the embodiment is different from the connecting circuit according to the second embodiment in an arrangement on the preceding stage of a signal midpoint detection unit. The remaining arrangement is similar to that in the second embodiment.
Arrangement of Connecting Circuit
As shown in FIG. 6, a connecting circuit 30 according to the embodiment includes, for a plurality of (N) inputs and outputs, an inter-channel (ch) interpolation initial voltage value (VL) detection circuit 301, a plurality of (N) signal midpoint detection units 303_1 to 303_N, a plurality of (N) bias adding units 304_1 to 304_N, and a plurality of (N) isolation elements 305_1 to 305_N. The arrangement of the signal midpoint detection units 303_1 to 303_N is similar to that in the first embodiment.

In the connecting circuit 30, the signal midpoint detection units 303_1 to 303_N and the bias adding units 304_1 to 304_N are series-connected parallel to the isolation elements 305_1 to 305_N. The output of the inter-ch interpolation VL detection circuit 301 connected to a plurality of input terminals 311_1 to 311_N is input (connected) to the signal midpoint detection units 303_1 to 303_N.

The inter-ch interpolation VL detection circuit 301 is connected to the input terminals 311_1 to 311_N, and detects a signal of a low voltage among signals of a plurality of channels. More specifically, as shown in FIG. 7, the inter-ch interpolation VL detection circuit 301 includes diode circuits 3011_1 to 3011_N between the input terminals 311_1 to 311_N and the signal midpoint detection units 303_1 to 303_N, and a resistor (Rb) 3012 connected to a voltage source (V1) 3013 is connected to the inputs of the signal midpoint detection units 303_1 to 303_N.

The diode circuits 3011_1 to 3011_N are ideal diode circuits having a forward threshold voltage of o V. The diode circuits 3011_1 to 3011_N are connected so that the direction of the input terminals 311_1 to 311_N from the inputs of the signal midpoint detection units 303_1 to 303_N becomes a forward direction.
Operation of Connecting Circuit
First, the operation of the inter-ch interpolation VL detection circuit 301 will be described. The voltage V1 of the voltage source is set in advance to satisfy VL<V1<VH between the low voltage VL and high voltage VH of an input signal.

When the voltage VL is input as an initial voltage value to one input terminal (for example, the input terminal 311_1) out of the input terminals 311_1 to 311_N, the voltage VL is applied in the forward direction to turn on the diode circuit (for example, 3011_1) because of V1>VL. Hence, an input voltage Va of the signal midpoint detection units 303_1 to 303_N becomes equal to VL. Since the diode circuit in which the input voltage is VH is OFF, VH does not influence Va.

The CR time constant is formed by the Rb 3032 and the parasitic capacitances of diodes or the like present at the inputs of the signal midpoint detection units 303_1 to 303_N. After all the input terminals 311_1 to 311_N change to VH, Va changes to V1 in accordance with the CR time constant. After the lapse of a predetermined time determined by the CR time constant, Va=V1. If a state in which all the input terminals 311_1 to 311_N become VH is not continued for a predetermined time or longer, Va does not change from VL. In other words, Va maintains the VL state in most of the time.

If Va=V1, a signal changes between V1 and VH and the signal change amount (amplitude) decreases, compared to a case where the signal changes between VL and VH when Va=VL. This results in a disadvantage in which, for example, detection of a signal becomes difficult.

The probability at which the above-described change of Va from VL occurs will be explained below.

The probability at which the change of Va occurs is calculated as follows by determining the CR time constant so that Va changes when a state in which all the input terminals 311_1 to 311_N become VH is generated successively for 10 bits.

Assuming that the bit rate is 10 Gbps, the probability at which VH continues for 10 bits is $1/2^{10}$. For N=1, $2^{10}/10$ Gbps=102.4 nsec, and Va shifts once in 102.4 nsec. For N=8, the probability at which VH continues for 10 bits in all channels is $1/2^{80}$, and $2^{80}/10$ Gbps=$1.21\times10^{14}$ sec=$3.8\times10^6$ years. From this result, Va changes only once in $3.8\times10^6$ years. As the number of channels increases, the probability at which Va changes decreases.

Since the probability at which the change of Va from VL occurs is very low, the change of Va from VL rarely occurs.

In this way, when the voltage VL is input as an initial voltage value to the inter-ch interpolation VL detection circuit 301, the input voltage Va of the signal midpoint detection units 303_1 to 303_N is maintained at the initial voltage value VL.

Next, the operation of the connecting circuit 30 will be explained.

As described above, the input Va of the signal midpoint detection units 303_1 to 303_N is maintained at the low voltage VL serving as the initial voltage value, so outputs from the signal midpoint detection units 303_1 to 303_N to the bias adding units 304_1 to 304_N are also maintained at the low voltage VL.

When the voltage VL is input to one input terminal out of the input terminals 311_1 to 311_N, the low voltage VL is kept output to the bias adding units 304_1 to 304_N.

As a result, similar to the first and second embodiments, the midpoint voltage calculation units of the signal midpoint detection units 303_1 to 303_N output differences between the outputs of low-pass filters and the output (initial voltage value VL) of the inter-ch interpolation VL detection circuit 301. Upon receiving the differences, the bias adding units 304_1 to 304_N bias baseband signals input to transmission circuits, reducing the waveform distortions of the baseband signals.

Similar to the first embodiment, the connecting circuit 30 according to the embodiment can be used for a transmission interface. In the transmission interface, terminal loads are connected to the respective input terminals of the connecting circuit 30, and transmission circuits are connected to the respective output terminals.

As described above, even if a capacitor is incorporated in a transmission interface chip without arranging a chip capacitor (chip capacitor for a DC block) between a data source and a transmission interface including a plurality of transmission circuits, the connecting circuit according to the embodiment can transfer, to the transmission circuits, a waveform distortion-reduced baseband signal including a DC component. The chip serving as the data source and the chip of the transmission interface can be mounted at high density.

In the connecting circuit according to the second embodiment, VL is extracted in one input/output circuit and regarded as a minimum voltage value in N input signals to detect a midpoint voltage. However, VL is not the minimum voltage in the N input signals, so an accurate midpoint voltage in the N input signals is not detected. The connecting circuit according to the third embodiment extracts a minimum voltage in N input signals, and can detect a more accurate midpoint voltage in the N input signals.

When a signal is input to the other input terminal before input to one input terminal, the connecting circuit according to the second embodiment cannot reduce the waveform distortion of a baseband signal. To the contrary, the connecting circuit according to the third embodiment detects the low voltage VL with respect to input signals 1 to N, and can reduce the waveform distortion of a baseband signal regardless of whether a signal is input to any of the input terminals 1 to N.

Fourth Embodiment

A connecting circuit and a communication interface according to the fourth embodiment of the present invention will be described with reference to FIGS. 8 and 9.

Arrangement of Connecting Circuit

Figure 8:
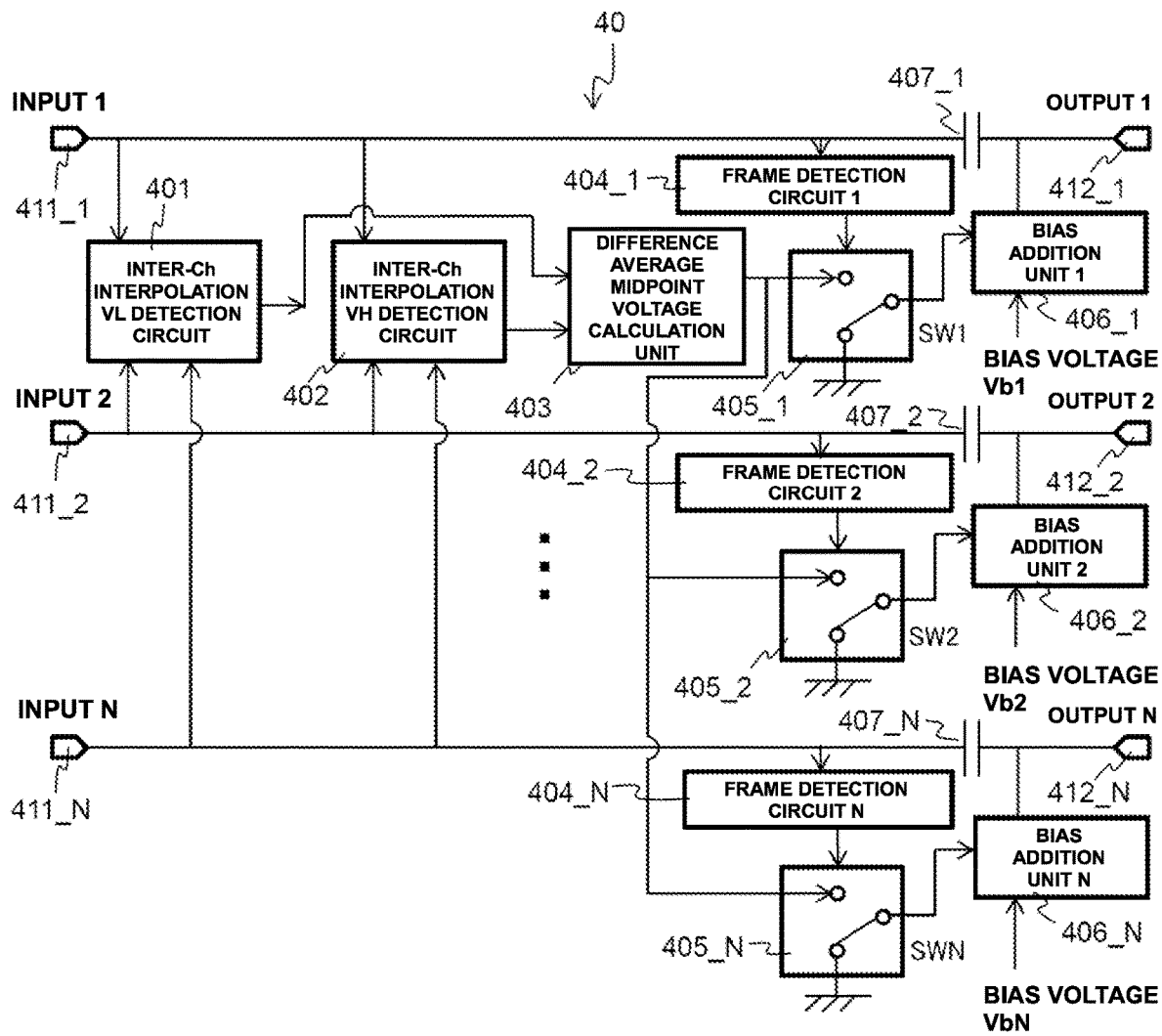
FIG. 8 is a block diagram showing the arrangement of a connecting circuit according to the fourth embodiment of the present invention.
Figure 9:
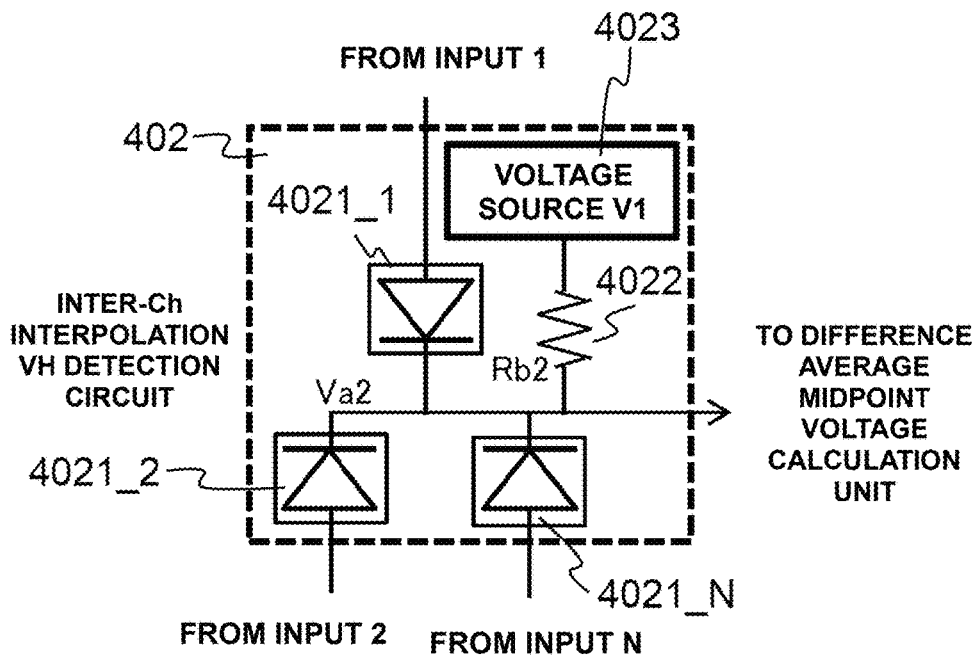
FIG. 9 is a view showing an example of the arrangement of an inter-ch interpolation VH detection circuit in the connecting circuit according to the fourth embodiment of the present invention.
Figure 10:
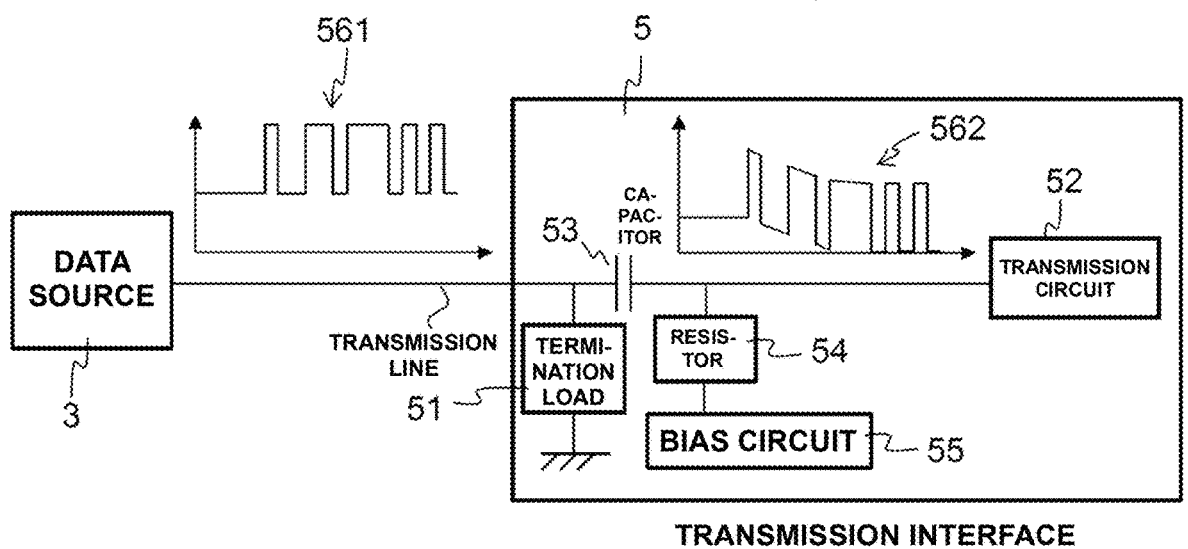
FIG. 10 is a block diagram showing the connection form of a conventional transmission interface.

As shown in FIG. 8, a connecting circuit 40 according to the embodiment includes, for a plurality of (N) inputs and outputs, an inter-channel (ch) interpolation VL detection circuit 401, an inter-channel (ch) interpolation VH detection circuit 402, a difference average midpoint voltage calculation unit 403, a plurality of (N) frame detection circuits 404_1 to 404_N, a plurality of (N) switching (SW) elements 405_1 to 405_N, a plurality of (N) bias adding units 406_1 to 406_N, and a plurality of (N) isolation elements 407_1 to 407_N.

In the connecting circuit 40, the frame detection circuits 404_1 to 404_N, the plurality of (N) switching (SW) elements 405_1 to 405_N, and the plurality of (N) bias adding units 406_1 to 406_N are series-connected parallel to the plurality of (N) isolation elements 407_1 to 407_N. The inter-ch interpolation VL detection circuit 401 and the inter-ch interpolation VH detection circuit 402 that are connected to a plurality of input terminals 411_1 to 411_N are connected to the difference average midpoint voltage calculation unit 403. The difference average midpoint voltage calculation unit 403 are connected to the plurality of (N) switching (SW) elements 405_1 to 405_N.

The inter-channel (ch) interpolation VL detection circuit 401 has an arrangement similar to that in the third embodiment, and includes diode circuits between the input terminals 411_1 to 411_N and the input of the difference average midpoint voltage calculation unit 403. A resistor (Rb) connected to a voltage source is connected to the input of the difference average midpoint voltage calculation unit 403.

The inter-ch interpolation VH detection circuit 402 is connected to the input terminals 411_1 to 411_N in parallel with the inter-ch interpolation VL detection circuit 401, and detects a signal of a high voltage among signals of a plurality of channels. More specifically, as shown in FIG. 9, the inter-ch interpolation VH detection circuit 402 includes diode circuits 4021_1 to 4021_N between the input terminals 411_1 to 411_N and the input of the difference average midpoint voltage calculation unit 403, and a resistor (Rb) 4022 connected to a voltage source (V1) 4023 is connected to the input of the difference average midpoint voltage calculation unit 403. The diode circuits 4021_1 to 4021_N are ideal diode circuits having a forward threshold voltage of 0 V. The diode circuits 4021_1 to 4021_N are connected so that the direction of input from the input terminals 411_1 to 411_N to the difference average midpoint voltage calculation unit 403 becomes a forward direction.

Operation of Connecting Circuit

First, the operation of the inter-ch interpolation VH detection circuit 402 will be described. The voltage V1 of the voltage source is set in advance to satisfy VL<V1<VH between the low voltage VL and high voltage VH of an input signal.

When the voltage VH is input to one input terminal (for example, the input terminal 411_1) out of the input terminals 411_1 to 411_N, the voltage VH is applied in the forward direction to turn on the diode circuit (for example, 4021_1) because of V1<VH. Then, an input voltage Va2 of the difference average midpoint voltage calculation unit 403 becomes equal to VH. Since the diode circuit in which the input voltage is VL is OFF, VL does not influence Va2. Hence, when an input at which the voltage is VH exists among inputs 1 to N, Va2 becomes VH.

The CR time constant is formed by the resistor (Rb2) 4022 and the parasitic capacitance of a diode or the like present at the input of the signal difference average midpoint voltage calculation unit 403. After all the input terminals 411_1 to 411_N become VL, Va2 changes to V1 in accordance with the CR time constant. After the lapse of a predetermined time determined by the CR time constant, Va2=V1. If a state in which all the input terminals 411_1 to 411_N become VL is not continued for a predetermined time or longer, Va2 does not change from VH. In other words, Va2 maintains the VH state in most of the time.

If Va2=V1, a signal changes between V1 and VH and the signal change amount (amplitude) decreases, compared to a case where the signal changes between VL and VH when Va2=VH. This results in a disadvantage in which, for example, detection of a signal becomes difficult.

The probability at which the change of Va2 from VH occurs is calculated similarly to the probability at which the change of Va from VL occurs in the third embodiment. The state in which all the input terminals 411_1 to 411_N become VL rarely occurs except a case where no data is input to all transmission circuits, and the probability decreases as the number of channels increases.

Since the probability at which the change of Va2 from VH occurs is very low, the change of Va2 from VH hardly occurs.

As described above, when the voltage VH is input to the inter-ch interpolation VH detection circuit 402, the input voltage Va2 of the difference average midpoint voltage calculation unit 403 is maintained at VH.

Next, the operation of the connecting circuit 40 will be explained.

The inter-channel (ch) interpolation VL detection circuit 401 has an arrangement similar to that in the third embodiment, and detects a signal of a low voltage among signals of a plurality of channels.

As described above, the inter-channel (ch) interpolation VH detection circuit 402 detects a signal of a high voltage among signals of a plurality of channels.

The difference average midpoint voltage calculation unit 403 calculates a midpoint voltage between VL and VH from the output voltage VL of the inter-channel (ch) interpolation VL detection circuit 401 and the output voltage VH of the inter-channel (ch) interpolation VH detection circuit 402, and outputs the midpoint voltage to the switching (SW) elements 405_1 to 405_N.

For example, the difference average midpoint voltage calculation unit 403 is constituted by connecting a voltage division circuit to the subsequent stage of a differential circuit. The differential circuit outputs a differential voltage between VL and VH, and the voltage division circuit divides the voltage to halve the differential voltage. Accordingly, the midpoint voltage between VL and VH is calculated.

Similar to the first embodiment, the frame detection circuits 404_1 to 404_N read a change of a data signal, output a frame detection signal at the high voltage VH, and once the frame detection signal is output at the high voltage VH, keep outputting it to the switching (SW) elements 405_1 to 405_N.

When the frame detection signal is input at VH, the switching (SW) elements 405_1 to 405_N are turned on and output the output voltage (midpoint voltage) of the difference average midpoint voltage calculation unit 403 to the bias adding units 406_1 to 406_N.

Similar to the first embodiment, the bias adding units 406_1 to 406_N output the sums of bias voltages Vb1 to VbN of the transmission circuits and the outputs of the switching (SW) elements 405_1 to 405_N.

In this manner, when data signals are input to the respective input terminals, the bias adding units 406_1 to 406_N add the midpoint voltage to the bias voltages. As a result, the baseband signals input from the respective input terminals are biased at Vb1 to VbN before data input, and Vb1 to VbN+ midpoint voltage after data input, and then output to the transmission circuits.

Similar to the first to third embodiments, the baseband signals input from the bias adding units 406_1 to 406_N to the transmission circuits are biased, reducing the waveform distortions of the baseband signals.

Similar to the first embodiment, the connecting circuit 40 according to the embodiment can be used for a transmission interface. In the transmission interface, terminal loads are connected to the respective input terminals of the connecting circuit 40, and transmission circuits are connected to the respective output terminals.

As described above, even if a capacitor is incorporated in a transmission interface chip without arranging a chip capacitor (chip capacitor for a DC block) between a data source and a transmission interface including a plurality of transmission circuits, the connecting circuit according to the embodiment can transfer, to the transmission circuits, a waveform distortion-reduced baseband signal including a DC component. The chip serving as the data source and the chip of the transmission interface can be mounted at high density.

The connecting circuit according to the embodiment extracts even a high voltage in addition to a low voltage in N input signals, and can detect a more accurate midpoint voltage in the N input signals, compared to the connecting circuit according to the third embodiment.

Similar to the connecting circuit according to the third embodiment, the connecting circuit according to the embodiment detects the low voltage VL and the high voltage VH in the input signals 1 to N, and can reduce the waveform distortion of the baseband signal regardless of whether a signal is input to any of the input terminals 1 to N.

In the embodiments of the present invention, the structure, dimensions, material, and the like of each component have been exemplified in the arrangement, manufacturing method, and the like of the connecting circuit, but the present invention is not limited to them as long as the functions of the connecting circuit are implemented and the effects are obtained.

Industrial Applicability

The embodiments of the present invention is directed to a connecting circuit connected to a transmission circuit and a communication interface, and can be applied to a communication transmission system.

EXPLANATION OF THE REFERENCE NUMERALS AND SIGNS

10 . . . connecting circuit, 11 . . . terminal load, 12 . . . transmission circuit, 101 . . . frame detection circuit, 102 . . . initial voltage value detection circuit, 1021 . . . signal delay circuit, 1022 . . . sample-and-hold circuit, 103 . . . signal midpoint detection unit, 1031 . . . low-pass filter, 1032 . . . midpoint voltage calculation unit, 104 . . . bias adding unit, 105 . . . isolation element, 111 . . . input terminal, 112 . . . output terminal

The invention claimed is:

1. A connecting circuit connected to a preceding stage of a transmission circuit and configured to receive a baseband signal, the connecting circuit comprising:
an isolation element connected between an input terminal and an output terminal;
a signal midpoint detection circuit connected parallel to the isolation element;
a bias adding circuit connected in series with the signal midpoint detection circuit; and
an initial voltage value detection circuit connected to a frame detection circuit,
wherein the initial voltage value detection circuit holds an initial voltage value of the baseband signal in accordance with a signal of the frame detection circuit, and outputs the initial voltage value to the signal midpoint detection circuit,
the signal midpoint detection circuit detects a midpoint voltage from the baseband signal and the initial voltage value, and outputs the midpoint voltage to the bias adding circuit, and
the bias adding circuit adds the midpoint voltage to a bias voltage for biasing the baseband signal.

2. The connecting circuit according to claim 1, wherein the initial voltage value detection circuit includes:
a signal delay circuit connected to the input terminal; and
a sample-and-hold circuit connected to the signal delay circuit,
the signal midpoint detection circuit includes:
a low-pass filter connected to the input terminal; and
a midpoint voltage calculation circuit connected to the low-pass filter,
the sample-and-hold circuit holds the initial voltage value of the baseband signal input from the signal delay circuit in accordance with the signal of the frame detection circuit, and outputs the initial voltage value to the midpoint voltage calculation circuit, and
the midpoint voltage calculation circuit outputs, to the bias adding circuit, a difference between an output of the low-pass filter and an output of the sample-and-hold circuit.

3. The connecting circuit according to claim 2, wherein the isolation element includes a plurality of isolation elements,
the signal midpoint detection circuit includes a plurality of signal midpoint detection circuits,
the bias adding circuit includes a plurality of bias adding circuits,
the plurality of signal midpoint detection circuits are respectively connected parallel to the respective plurality of isolation elements,
the initial voltage value detection circuit outputs the initial voltage value to the respective plurality of signal midpoint detection circuits, and
the respective plurality of signal midpoint detection circuits output the midpoint voltage to the respective plurality of bias adding circuits.

4. A communication interface comprising a connecting circuit defined in claim 2.

5. The connecting circuit according to claim 1, wherein the isolation element includes a plurality of isolation elements,
the signal midpoint detection circuit includes a plurality of signal midpoint detection circuits,
the bias adding circuit includes a plurality of bias adding circuits,
the plurality of signal midpoint detection circuits are respectively connected parallel to the respective isolation elements,
the initial voltage value detection circuit outputs the initial voltage value to the respective signal midpoint detection circuits, and
the respective signal midpoint detection circuits output the midpoint voltage to the respective bias adding circuits.

6. A communication interface comprising a connecting circuit defined in claim 5.

7. A communication interface comprising a connecting circuit defined in claim 1.

8. A connecting circuit connected to a preceding stage of a plurality of transmission circuits and configured to receive a plurality of baseband signals, the connecting circuit comprising:
a plurality of isolation elements respectively connected between a plurality of input terminals and a plurality of output terminals;
a plurality of signal midpoint detection circuits connected parallel to the respective plurality of isolation elements;
a plurality of bias adding circuits connected in series with the respective plurality of signal midpoint detection circuits; and
an inter-channel interpolation low voltage (VL) detection circuit,
wherein the inter-channel interpolation VL detection circuit detects a low-voltage signal among the plurality of baseband signals, and outputs the low-voltage signal to the respective signal midpoint detection circuits,
the plurality of signal midpoint detection circuits detect a midpoint voltage from the respective plurality of baseband signals and the low-voltage signal, and output the midpoint voltage to the plurality of bias adding circuits, and the plurality of bias adding circuits add the midpoint voltage to a respective bias voltage for biasing the respective plurality of baseband signals.

9. The connecting circuit according to claim 8, wherein the inter-channel interpolation VL detection circuit includes a plurality of diode circuits, a resistor, and a voltage source,
each of the plurality of baseband signals is input to one end of each of the plurality of diode circuits,
the voltage source is connected via the resistor to the other end of each of the plurality of diode circuits, and
each of the plurality of diode circuits is connected to make a direction from the one end to the other end to serve as a forward direction.

10. A communication interface comprising a connecting circuit defined in claim 9.

11. A communication interface comprising a connecting circuit defined in claim 8.

12. A connecting circuit connected to a preceding stage of a plurality of transmission circuits and configured to receive a plurality of baseband signals, the connecting circuit comprising:
a plurality of isolation elements respectively connected between a plurality of input terminals and a plurality of output terminals;
a plurality of frame detection circuits connected parallel to the respective plurality of isolation elements;
a plurality of switching elements connected in series with the respective plurality of frame detection circuits;
a plurality of bias adding circuits connected in series with the respective plurality of switching elements; and
a difference average midpoint voltage calculation circuit configured to receive an output of an inter-channel interpolation low voltage (VL) detection circuit and an output of an inter-channel interpolation high voltage (VH) detection circuit,
wherein the inter-channel interpolation VL detection circuit detects a low-voltage signal among the plurality of baseband signals, and outputs the low-voltage signal to the difference average midpoint voltage calculation circuit,
the inter-channel interpolation VH detection circuit detects a high-voltage signal among the plurality of baseband signals, and outputs the high-voltage signal to the difference average midpoint voltage calculation circuit,
the difference average midpoint voltage calculation circuit outputs, to the respective plurality of switching elements, a midpoint voltage based on the output of the inter-channel interpolation VL detection circuit and the output of the inter-channel interpolation VH detection circuit,
the plurality of switching elements output the midpoint voltage to the respective plurality of bias adding circuits in accordance with inputs from the respective plurality of frame detection circuits, and
the plurality of bias adding circuits add the midpoint voltage to a respective bias voltage for biasing the respective plurality of baseband signals.

13. The connecting circuit according to claim 12, wherein the inter-channel interpolation VH detection circuit includes a plurality of diode circuits, a resistor, and a voltage source,
each of the plurality of baseband signals is input to one end of each of the plurality of diode circuits,
the voltage source is connected via the resistor to the other end of each of the plurality of diode circuits, and
each of the plurality of diode circuits is connected to make a direction from the one end to the other end to serve as a forward direction.

14. The connecting circuit according to claim 13, wherein the inter-channel interpolation VL detection circuit includes a plurality of diode circuits, a resistor, and a voltage source,
each of the plurality of baseband signals is input to one end of each of the plurality of diode circuits,
the voltage source is connected via the resistor to the other end of each of the plurality of diode circuits, and
each of the plurality of diode circuits is connected to make a direction from the one end to the other end to serve as a forward direction.

15. A communication interface comprising a connecting circuit defined in claim 13.

16. The connecting circuit according to claim 12, wherein the inter-channel interpolation VL detection circuit includes a plurality of diode circuits, a resistor, and a voltage source,
each of the plurality of baseband signals is input to one end of each of the plurality of diode circuits,
the voltage source is connected via the resistor to the other end of each of the plurality of diode circuits, and
each of the plurality of diode circuits is connected to make a direction from the one end to the other end to serve as a forward direction.

17. A communication interface comprising a connecting circuit defined in claim 12.

* * * * *